(12) United States Patent
Lin et al.

(10) Patent No.: US 11,056,436 B2
(45) Date of Patent: Jul. 6, 2021

(54) INTEGRATED FAN-OUT STRUCTURE WITH RUGGED INTERCONNECT

(71) Applicant: Taiwan Semiconductor Manufacturing Co., Ltd., Hsin-Chu (TW)

(72) Inventors: Shih Ting Lin, Taipei (TW); Szu-Wei Lu, Hsinchu (TW); Jing-Cheng Lin, Hsinchu (TW); Chen-Hua Yu, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/175,696

(22) Filed: Jun. 7, 2016

(65) Prior Publication Data

US 2017/0352626 A1   Dec. 7, 2017

(51) Int. Cl.
| | | |
|---|---|---|
| *H01L 23/538* | (2006.01) | |
| *H01L 23/498* | (2006.01) | |
| *H01L 21/48* | (2006.01) | |
| *H01L 21/56* | (2006.01) | |
| *H01L 23/31* | (2006.01) | |
| *H01L 23/532* | (2006.01) | |

(52) U.S. Cl.
CPC ........ *H01L 23/5389* (2013.01); *H01L 21/486* (2013.01); *H01L 21/4853* (2013.01); *H01L 21/565* (2013.01); *H01L 23/3114* (2013.01); *H01L 23/49827* (2013.01); *H01L 23/5384* (2013.01); *H01L 23/5386* (2013.01); *H01L 23/53228* (2013.01); *H01L 21/568* (2013.01); *H01L 23/49811* (2013.01); *H01L 23/49816* (2013.01); *H01L 2224/04105* (2013.01); *H01L 2224/12105* (2013.01); *H01L 2224/19* (2013.01); *H01L 2224/32225* (2013.01); *H01L 2224/48091* (2013.01); *H01L 2224/48227* (2013.01); *H01L 2224/73267* (2013.01); *H01L 2224/92244* (2013.01); *H01L 2924/15311* (2013.01)

(58) Field of Classification Search
CPC ........... B81C 1/00642–00714; B81C 1/00206; B81B 3/0064–0094
See application file for complete search history.

(56) References Cited

U.S. PATENT DOCUMENTS

| | | | |
|---|---|---|---|
| 8,361,842 B2 | 1/2013 | Yu et al. | |
| 8,680,647 B2 | 3/2014 | Yu et al. | |
| 8,703,542 B2 | 4/2014 | Lin et al. | |
| 8,717,772 B2 * | 5/2014 | Inagaki | H01L 23/642 361/763 |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |

(Continued)

*Primary Examiner* — Marcos D. Pizarro
*Assistant Examiner* — Quinton A Brasfield
(74) *Attorney, Agent, or Firm* — Haynes and Boone, LLP

(57) ABSTRACT

A method of forming a package assembly includes forming a first dielectric layer over a carrier substrate; forming a conductive through-via over the first dielectric layer; treating the conductive through-via with a first chemical, thereby roughening surfaces of the conductive through-via; and molding a device die and the conductive through-via in a molding material.

20 Claims, 19 Drawing Sheets

(56) References Cited

U.S. PATENT DOCUMENTS

| | | |
|---|---|---|
| 8,809,996 B2 | 8/2014 | Chen et al. |
| 8,829,676 B2 | 9/2014 | Yu et al. |
| 8,877,554 B2 | 11/2014 | Tsai et al. |
| 9,313,904 B2 * | 4/2016 | Kaneko .................. H05K 3/465 |
| 2008/0029476 A1 * | 2/2008 | Ohmi .................. H05K 1/0216 |
| | | 216/13 |
| 2008/0314632 A1 * | 12/2008 | Wu ........................ H05K 1/115 |
| | | 174/263 |
| 2010/0059853 A1 * | 3/2010 | Lin .................... H01L 25/0657 |
| | | 257/528 |
| 2011/0291288 A1 | 12/2011 | Wu et al. |
| 2012/0247823 A1 * | 10/2012 | Kasai .................. H05K 3/3452 |
| | | 174/261 |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0131858 A1 * | 5/2014 | Pan ........................ H01L 24/19 |
| | | 257/737 |
| 2014/0203429 A1 | 7/2014 | Yu et al. |
| 2014/0225222 A1 | 8/2014 | Yu et al. |
| 2014/0252646 A1 * | 9/2014 | Hung .................. H01L 21/486 |
| | | 257/774 |
| 2014/0264930 A1 | 9/2014 | Yu et al. |
| 2015/0061149 A1 * | 3/2015 | Lin ........................ H01L 24/82 |
| | | 257/774 |
| 2015/0179560 A1 * | 6/2015 | Arisaka ................ H05K 1/0313 |
| | | 257/777 |
| 2016/0049363 A1 * | 2/2016 | Cheng .................... H01L 24/48 |
| | | 257/774 |
| 2016/0307788 A1 * | 10/2016 | Hu ...................... H01L 21/2885 |

\* cited by examiner

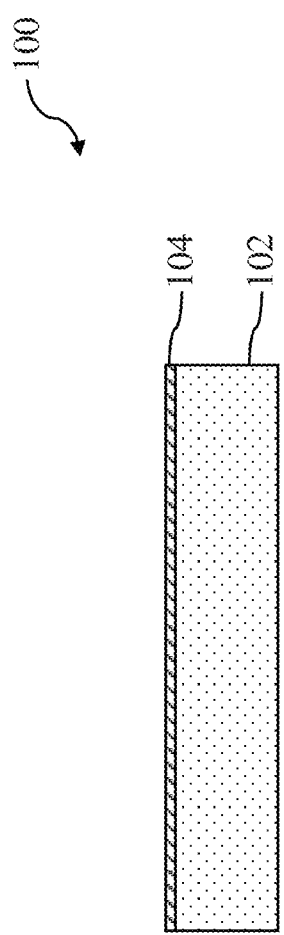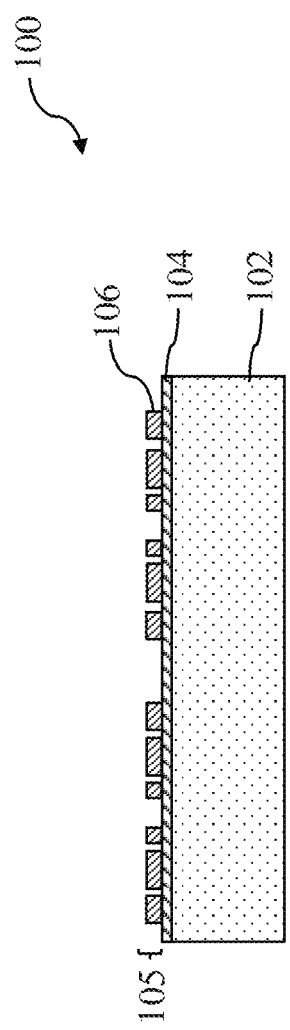
FIG. 2A
FIG. 2B

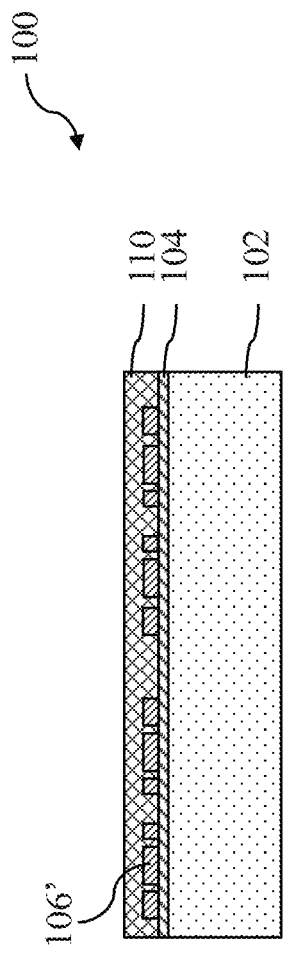
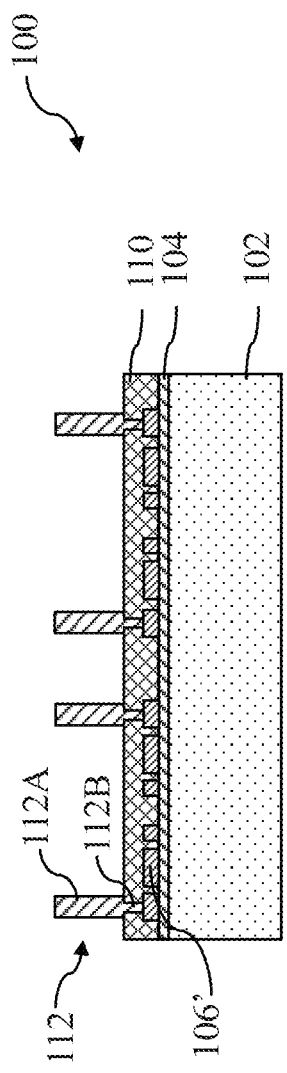

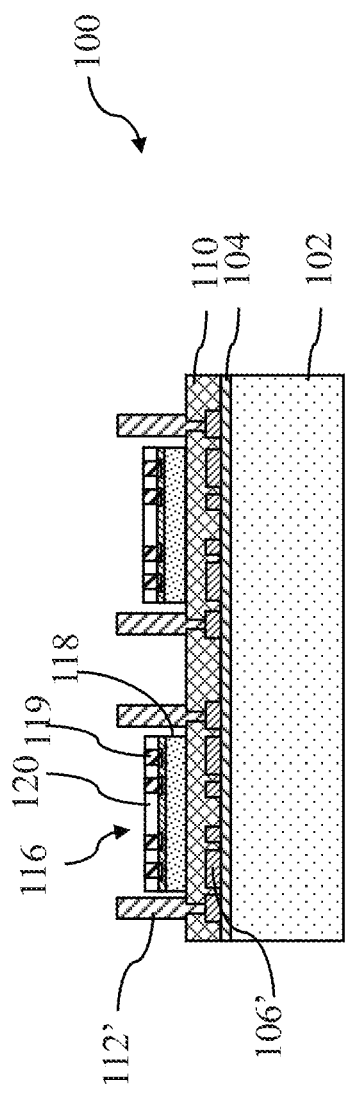
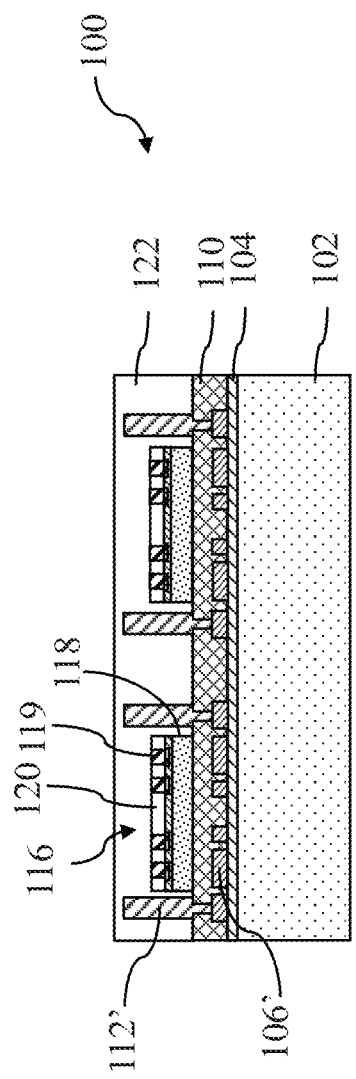

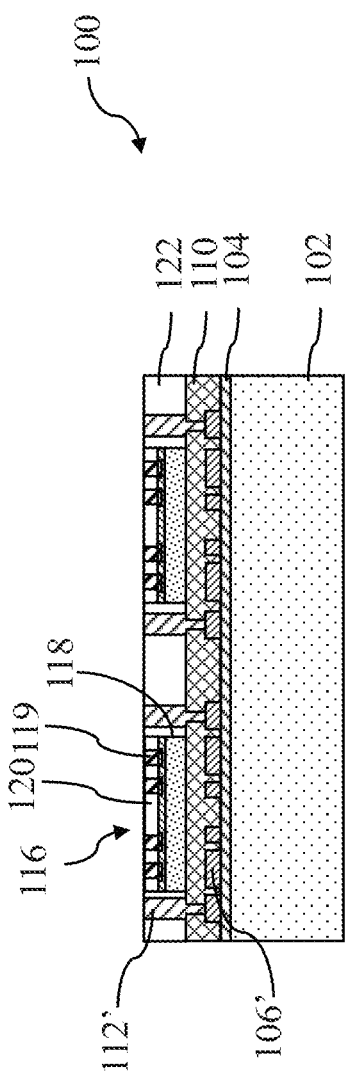
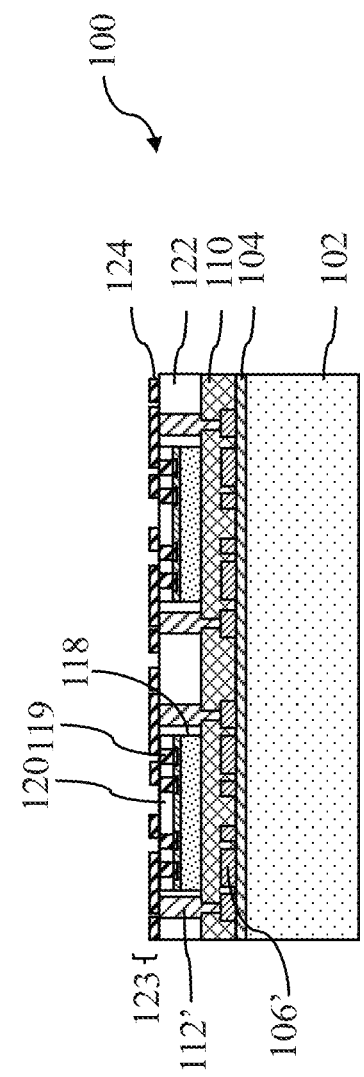

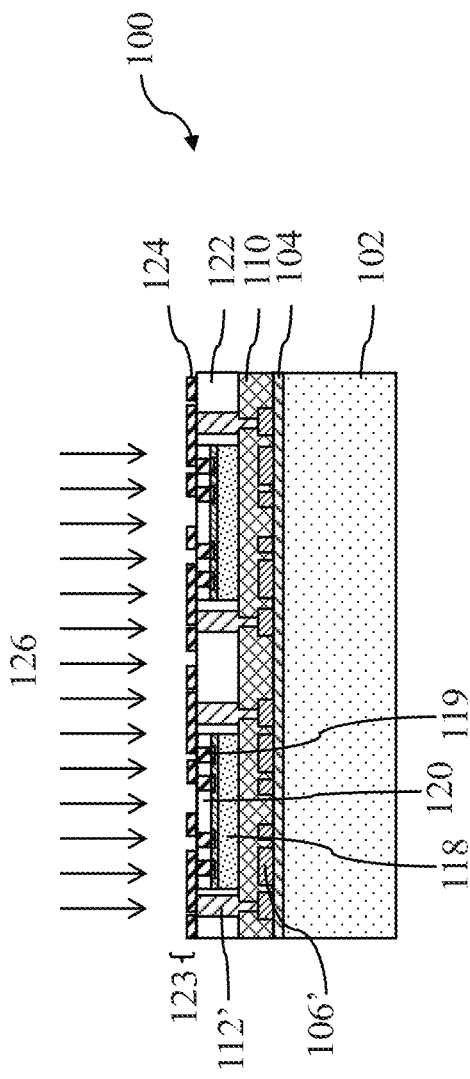
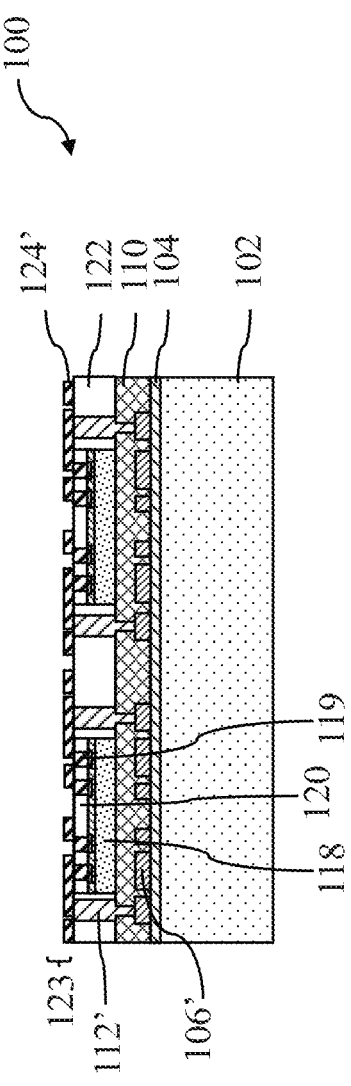
FIG. 2P
FIG. 2Q

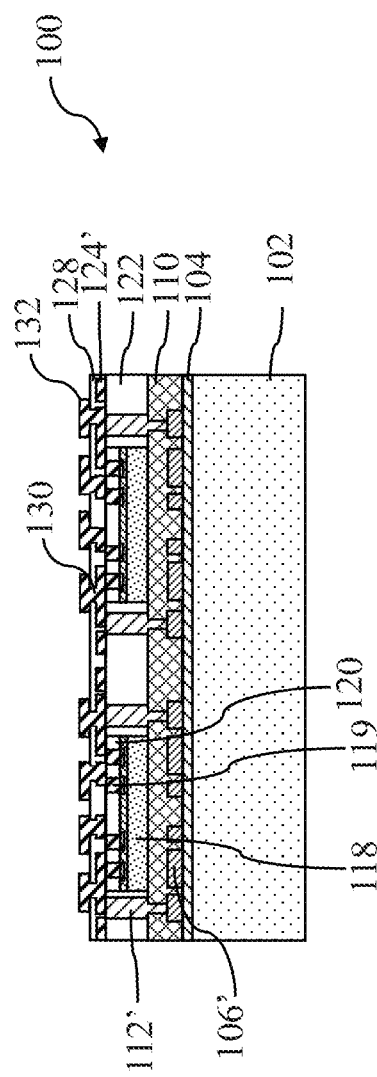
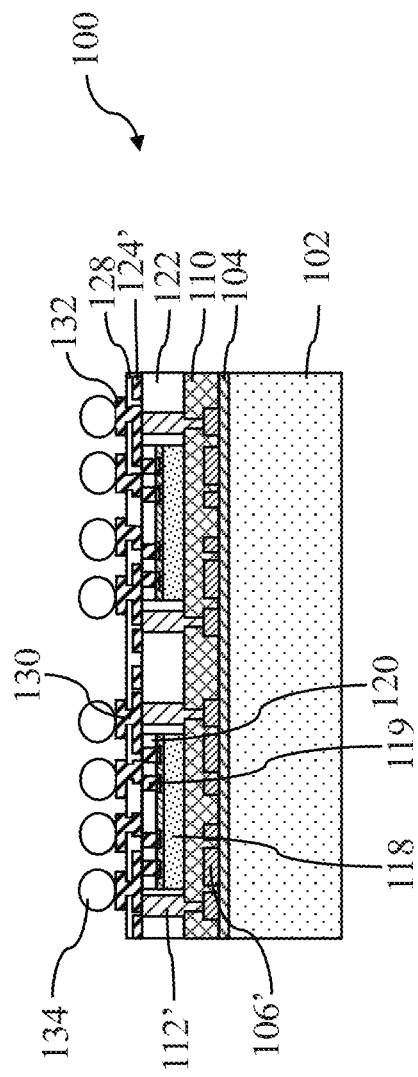
FIG. 2R
FIG. 2S

INTEGRATED FAN-OUT STRUCTURE WITH RUGGED INTERCONNECT

BACKGROUND

The semiconductor integrated circuit (IC) industry has experienced rapid growth. Technological advances in IC materials and design have produced generations of ICs where each generation has smaller and more complex circuits than the previous generation. Accordingly, semiconductor dies have increasingly greater numbers of I/O pads packed into smaller areas, creating difficulties in semiconductor IC packaging.

In one approach to solving the above problem, a process utilizing Integrated Fan-Out (InFo) package structures is used. In an InFo packaging process, semiconductor dies are sawed from wafers before they are packaged, and only "known-good-dies" are packaged. Further, I/O pads on a die are redistributed, or fanned out, to a greater area than the die. Hence the number of I/O pads packed on the surfaces of the dies can be increased. The redistribution of the I/O pads in an InFo package is often realized by connecting the I/O pads to external electrical connectors using metal interconnects such as conductive through-vias and redistribution lines. However, delamination sometimes occurs at interfaces between the metal interconnects and their surrounding dielectric layers due to poor adhesion of the two materials. Consequently, the reliability of InFo packages is not satisfactory.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A, 2B, 2C, 2D, 2G, 2H, 2I, 2J, 2L, 2M, 2N, 2O, 2P, 2Q, 2R, 2S, and 2T are cross-sectional views of a portion of a package assembly, in accordance with some embodiments.

FIGS. 2B-1, 2B-2, 2B-3, 2B-4, and 2B-5 are cross-sectional views of a portion of a package assembly having conductive redistribution lines formed therein, in accordance with an embodiment.

FIGS. 2H-1, 2H-2, 2H-3, 2H-4, 2H-5, and 2H-6 are cross-sectional views of a portion of a package assembly having conductive through-vias formed therein, in accordance with an embodiment.

DETAILED DESCRIPTION

Figure 1A:
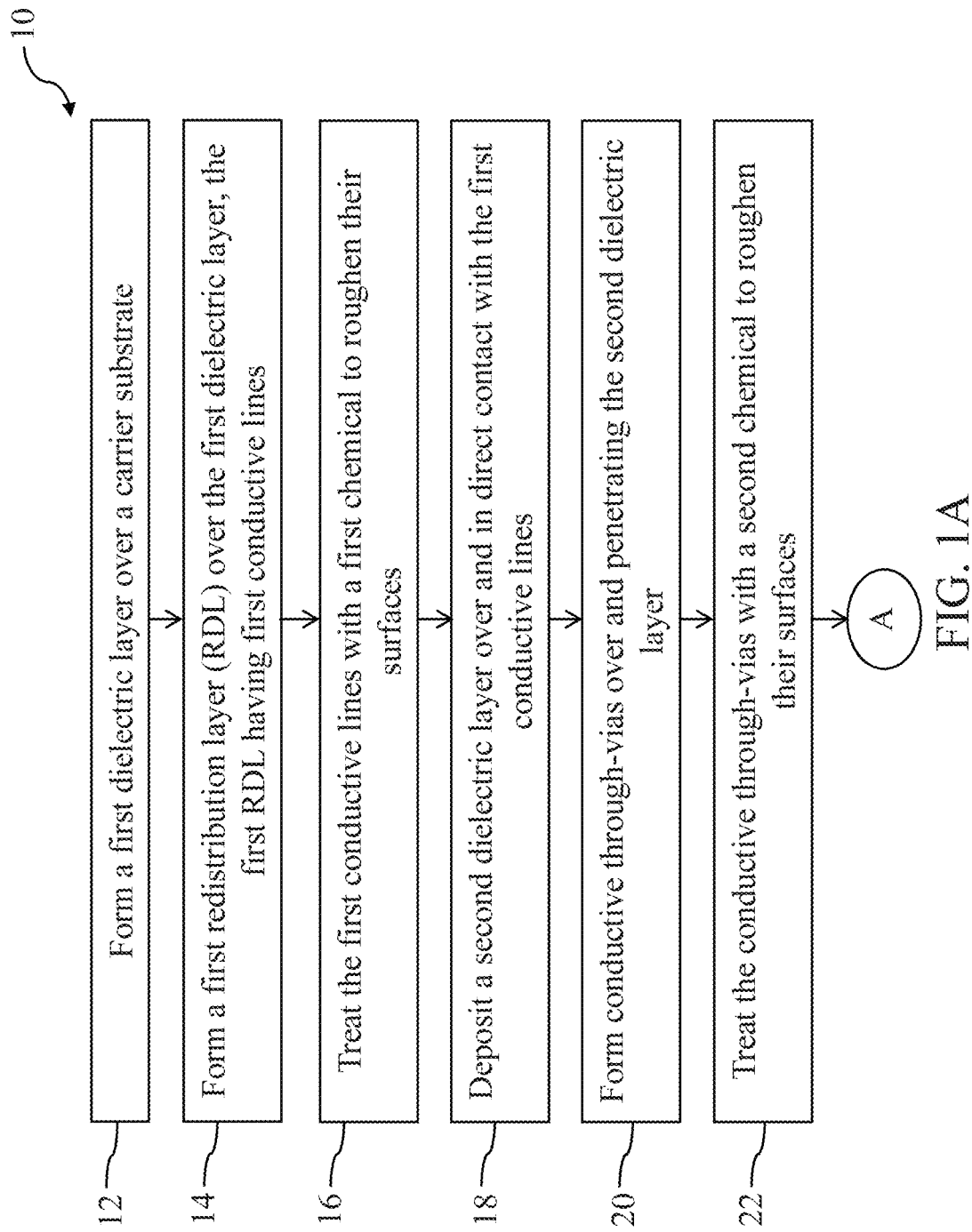
FIGS. 1A and 1B are a flow chart of a method of forming a package assembly having one or more semiconductor devices, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and methods of forming the same. More particularly, the present disclosure is related to InFo package assembly having rugged or roughened interconnects. In embodiments of the present disclosure, conductive through-vias and/or redistribution lines in an InFo package assembly are treated with a special chemical so as to roughen the surfaces thereof. The resultant rough surfaces help improve the adhesion of surrounding dielectric materials, such as PolyBenzOxazole (PBO) or a molding material, to the interconnects, thereby improving the reliability of the InFo package assembly. One of ordinary skill may recognize other examples of semiconductor devices that may benefit from aspects of the present disclosure.

Figure 1B:
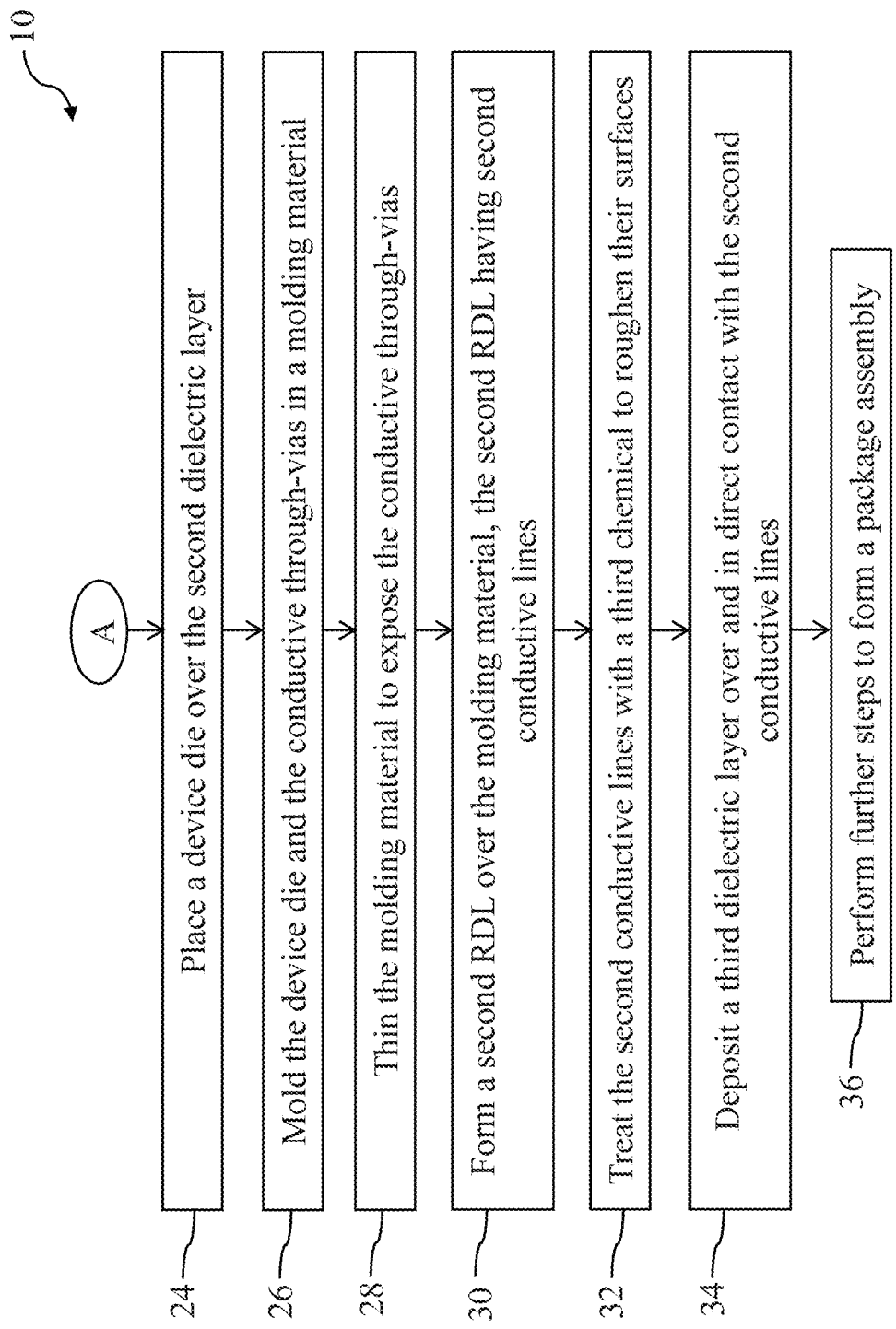

FIGS. 1A and 1B show a flow chart of a method 10 of forming a package assembly 100, according to various aspects of the present disclosure. The package assembly 100 may include one or more semiconductor dies molded in a molding material. The one or more semiconductor dies are assembled with various through-vias, redistribution lines, and electrical connectors such as solder balls to form one or more InFo packages. Subsequently, the one or more InFo packages are cut out from the package assembly 100 to become individual InFo packages. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2A-2T.

At operation 12, the method 10 (FIG. 1A) forms a first dielectric layer 104 over a carrier (or a carrier substrate) 102. Referring to FIG. 2A, the carrier 102 is used for carrying various layers and/or features in fabricating the package assembly 100, and will be removed in a later fabrication stage. In embodiments, the carrier 102 may be a glass carrier, a ceramic carrier, or the like. The dielectric layer 104 is also referred to as the buffer layer 104. In an embodiment, the dielectric layer 104 comprises a polymer such as polyimide, PBO, BenzoCycloButene (BCB), Ajinomoto Buildup Film (ABF), Solder Resist (SR) film, or the like. The dielectric layer 104 may comprise other dielectric materials. The dielectric layer 104 has planar top and bottom surfaces. Although not shown, the dielectric layer 104 is attached to the carrier 102 through an adhesive layer, which may be formed of an adhesive such as Ultra-Violet (UV) glue, Light-to-Heat Conversion (LTHC) glue, or other types of adhesives.

Figures 1, 2B:
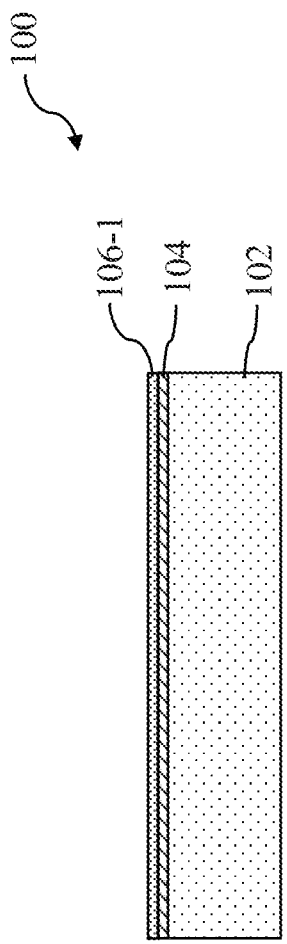

At operation 14, the method 10 (FIG. 1A) forms a first redistribution layer (RDL) 105 over the dielectric layer 104. Referring to FIG. 2B, the RDL 105 includes a plurality of conductive lines 106. The conductive lines 106 may comprise a metal or a metal alloy including aluminum, copper, tungsten, and/or alloys thereof. The conductive lines 106 may be formed by chemical vapor deposition (CVD), physical vapor deposition (PVD), plating, or other methods. In one example, the conductive lines 106 are formed by depositing one or more metal layers, and patterning the metal layers using photolithography process. In another example, the formation of the conductive lines 106 includes a plating process, which is discussed below in conjunction with FIGS. 2B-1 through FIGS. 2B-5.

Referring to FIG. 2B-1, a seed layer 106-1 is formed over the dielectric layer 104. The seed layer 106-1 may comprise copper, copper alloy, aluminum, titanium, titanium alloy, or combinations thereof. The seed layer 106-1 may comprise one layer or multiple layers of metal, and may be formed by CVD or PVD.

Figures 2, 2B:
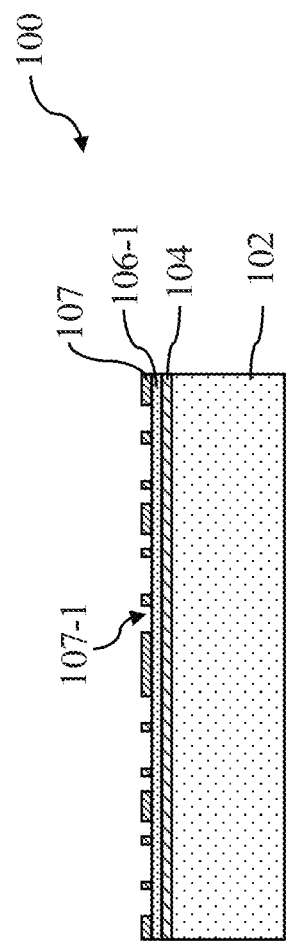

Referring to FIG. 2B-2, a photoresist (or resist) layer 107 is formed over the seed layer 106-1, and is patterned in a photolithography process to have a plurality of openings 107-1. The photolithography process may include exposing the resist layer 107 to a pattern that defines various geometrical shapes, performing post-exposure bake processes, and developing the resist layer 107 to form the openings 107-1. Portions of the seed layer 106-1 are exposed through the openings 107-1.

Figures 2, 2B, 3:
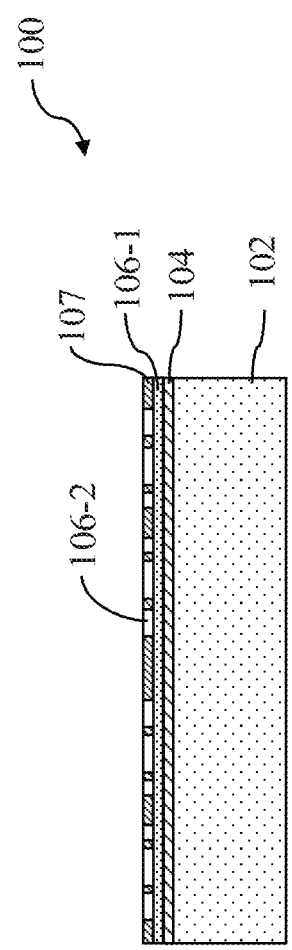
Figures 2, 2B, 3, 4:
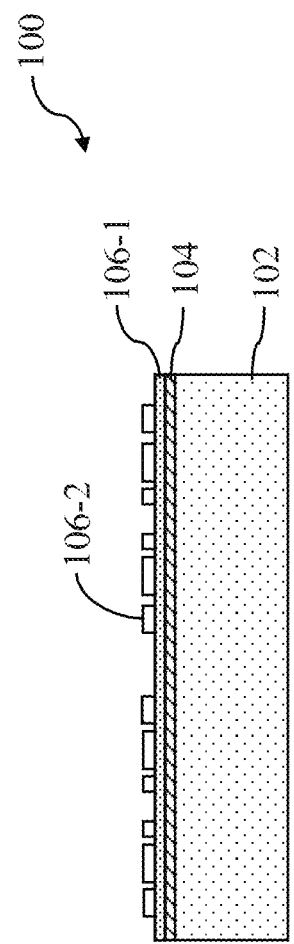
Figures 2, 2B, 3, 4, 5:
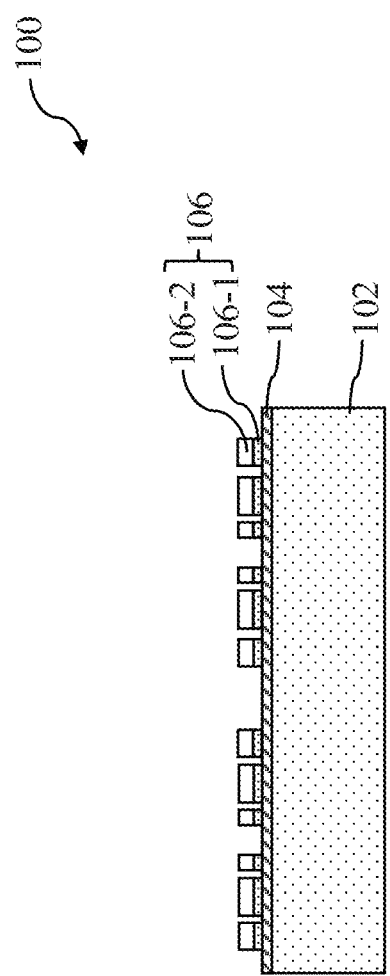

Referring to FIG. 2B-3, metal features 106-2 are formed in the openings 107-1 through plating, which may be electro plating or electro-less plating. The metal features 106-2 may comprise copper, aluminum, tungsten, nickel, or alloys thereof. The metal features 106-2 and the seed layer 106-1 may comprise the same material. Alternatively, they may comprise different materials.

Referring to FIG. 2B-4, the resist 107 is removed, leaving the metal features 106-2 over portions of the seed layer 106-1. The resist 107 may be removed by stripping in one example.

Referring to FIG. 2B-5, an etching process is performed to remove the portions of the seed layer 106-1 that are not covered by the metal features 106-2. The remaining portions of the seed layer 106-1 and the metal features 106-2 collectively form the conductive lines 106. The etching process may be a wet etching, a dry etching, a reactive ion etching, or other suitable methods.

Figure 2C:
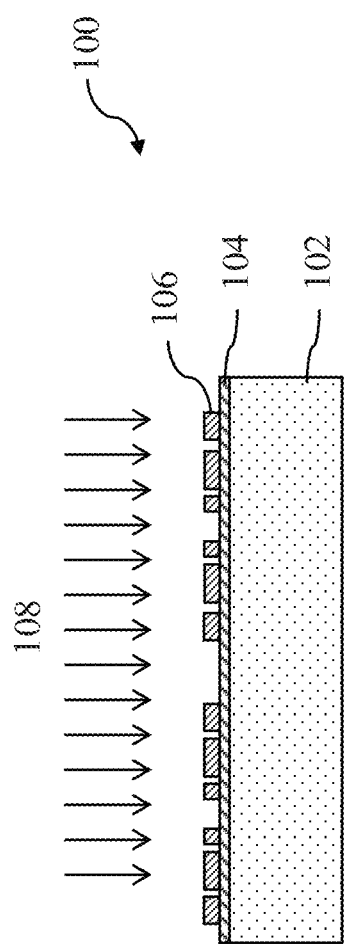
Figure 2D:
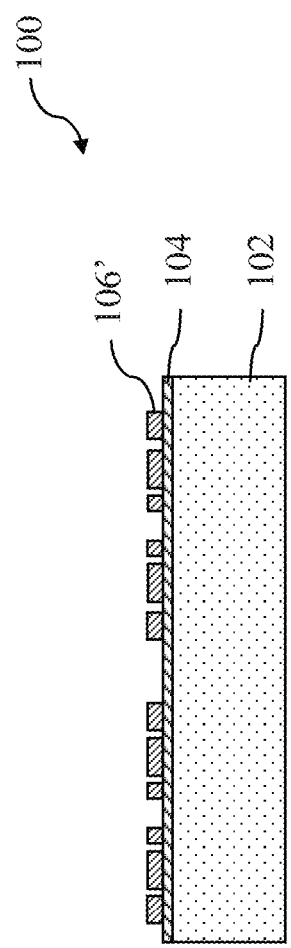

At operation 16, the method 10 (FIG. 1A) treats the conductive lines 106 with a first chemical 108 to roughen the surfaces of the conductive lines 106. Referring to FIG. 2C, the chemical 108 is applied to top and sidewall surfaces of the conductive lines 106. In an embodiment, the conductive lines 106 comprise copper, and the chemical 108 is an acidic solution that includes HCOOH. In an embodiment, the chemical 108 includes HCOOH with a concentration ranging from 0.1% to 50%. In an embodiment, the chemical 108 is selective to the micro structure and grain size of the material (e.g., copper) used for the conductive lines 106 so as to increase the local roughness of the surfaces thereof, which will be described later. In embodiments, the chemical 108 may be HCOOH, a mixture of $H_2SO_4$ and $H_2O_2$, or a mixture of HCOOH, $H_2SO_4$, and $H_2O_2$. Other acidic solutions may also be suitable for the chemical 108. The chemical 108 may be applied to the package assembly 100 using spraying, dipping, bathing, or other suitable methods. Further, the chemical 108 may be applied at a temperature ranging from 20 degrees Celsius (° C.) to 50° C. and for a duration ranging from 10 seconds to 10 minutes. The roughened conductive lines 106 are referred to as the conductive lines 106' hereafter (FIG. 2D).

Figure 2E:
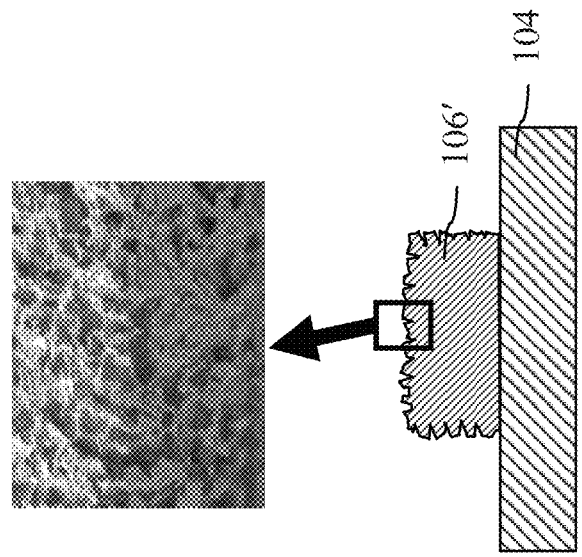
FIG. 2E shows surface structures of two redistribution lines, in accordance with some embodiments.
Figure 2E:
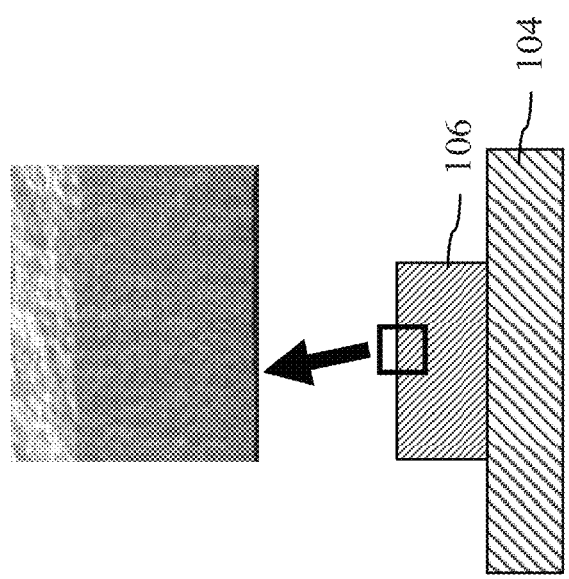
Figure 2F:
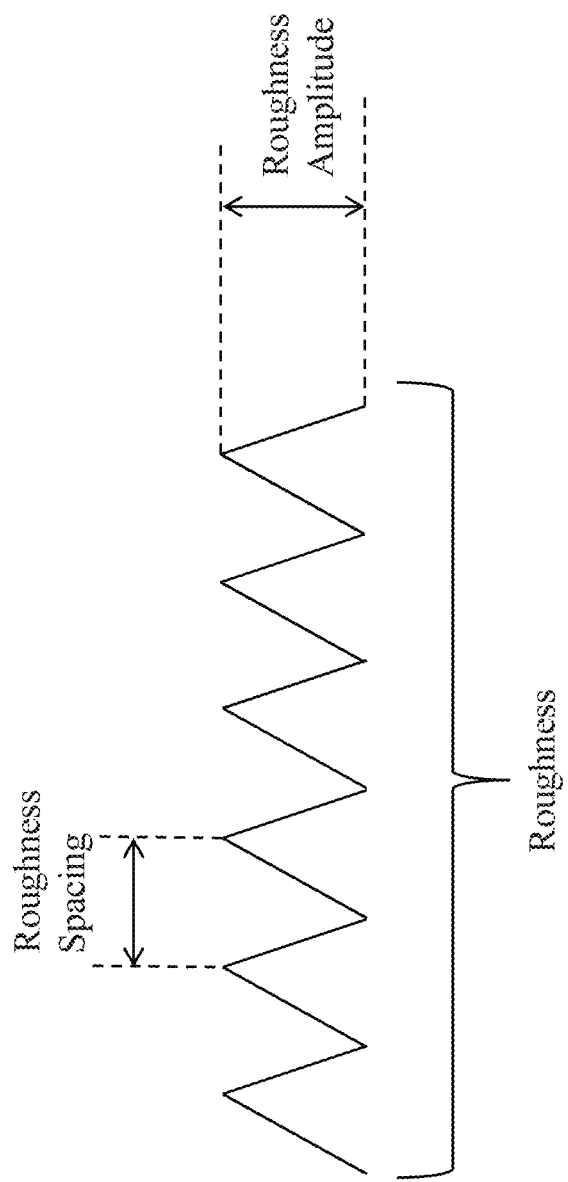
FIG. 2F illustrates a rough surface and some measures of roughness of the surface.

FIG. 2E shows a comparison of the surfaces of the conductive lines 106 (before being treated with the chemical 108) and the conductive lines 106' (after being treated with the chemical 108). The surface roughness of the conductive lines 106' increases substantially both in amplitude and frequency, compared to the conductive lines 106. For the convenience of discussion, the surface roughness of a conductive feature (e.g., the conductive lines 106') is characterized in the present disclosure by two parameters frequently used in the industry, Ra and Sm. Ra is the arithmetic average of absolute values of roughness amplitude, and Sm is the mean spacing between peaks of the roughness (FIG. 2F). Further, a local roughness (or local surface roughness) $R_{local}$ is defined in the present disclosure to be the ratio between Ra and Sm. In another word, $R_{local}$=Ra/Sm. A greater $R_{local}$ value indicates a rougher surface with more peaks and valleys in a unit area. Before being treated with the chemical 108, the conductive lines 106 have relatively smooth surfaces (FIG. 2E), which are characterized by $R_{local}$ of the respective surfaces being less than 1. After being treated with the chemical 108, the conductive lines 106' have relatively rougher surfaces (FIG. 2E), which are characterized by $R_{local}$ of the respective surfaces being greater than 1. In some instances, the $R_{local}$ of surfaces of the conductive lines 106' is much greater than 1 ($R_{local} \gg 1$), such as 10 or more. Other measures of the surface roughness may be used in addition to, or in place of, the parameters discussed above.

In the present embodiment, the operation 16 controls the resultant surface roughness of the conductive lines 106' by tuning the concentration of the chemical 108 and/or the various application parameters such as duration. The target roughness of the conductive lines 106' depends on the adhesion strength between the material of the conductive lines 106' and the material of a dielectric layer (described later) to be deposited surrounding the conductive lines 106'. The target roughness also depends on the resistance uniformity desired of the conductive lines 106' as resistance uniformity generally decreases when the surface is roughened. In embodiments, the operation 16 is tuned such that the Ra of the top and sidewall surfaces of the conductive lines 106' is greater than 0.1 micron (μm), such as ranging from 0.1 to about 1 μm. In a particular embodiment, the operation 16 is tuned such that the Ra of the top and sidewall surfaces of the conductive lines 106' ranges from about 0.25 to about 0.3 μm which produces acceptable resistance uniformity while providing enough roughness on the respective surfaces (hence good adhesion).

At operation 18, the method 10 (FIG. 1A) deposits a second dielectric layer 110 over the conductive lines 106'. Referring to FIG. 2G, the dielectric layer 110 is disposed over the conductive lines 106' and is in direct contact with the top and sidewall surfaces of the conductive lines 106'. In an embodiment, the dielectric layer 110 includes the same material as the dielectric layer 104. In alternative embodiments, the dielectric layers 104 and 110 may include different materials. In embodiments, the dielectric layer 110 may include a polymer such as polyimide, PBO, BenzoCycloButene (BCB), Ajinomoto Buildup Film (ABF), Solder Resist (SR) film, or the like. Due to the rough (or rugged) surfaces of the conductive lines 106', the dielectric layer 110 adheres to the conductive lines 106' much better than it would adhere to the conductive lines 106. In some experiment, an improvement of three or more times of adhesion strength has been observed. This provides better durability in the InFo package assembly 100 over conventional InFo packages.

Figures 1, 2H:
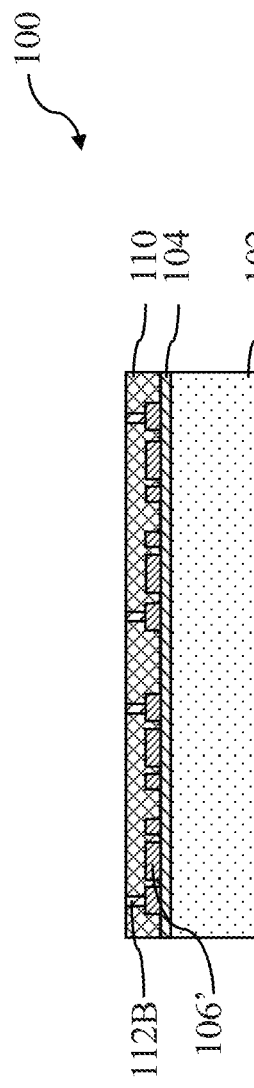
Figures 2, 2H:
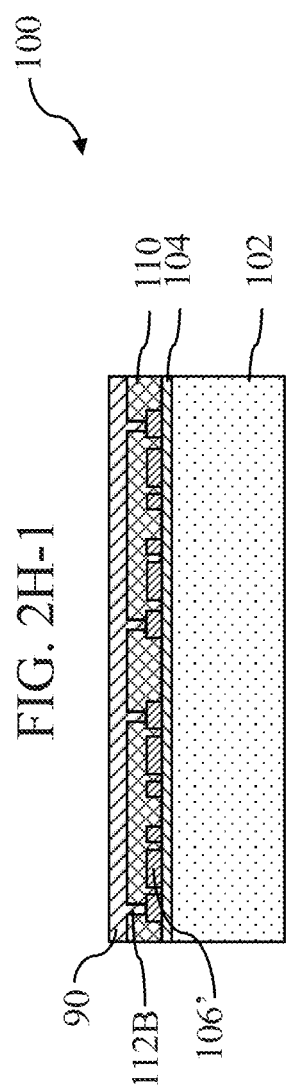
Figures 2, 2H, 3:
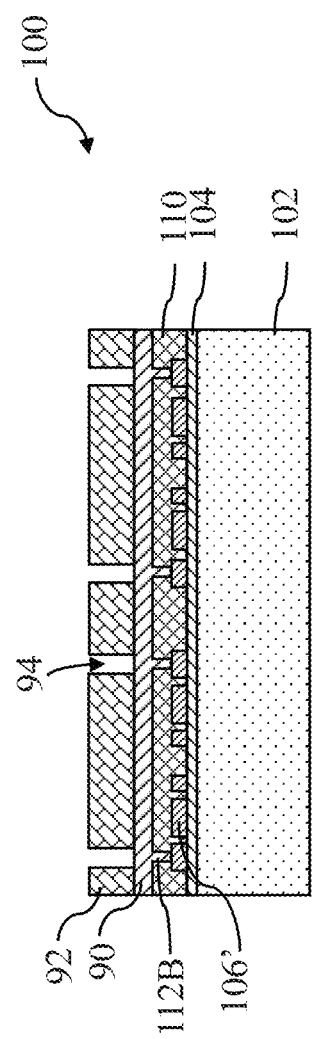
Figures 2, 2H, 3, 4:
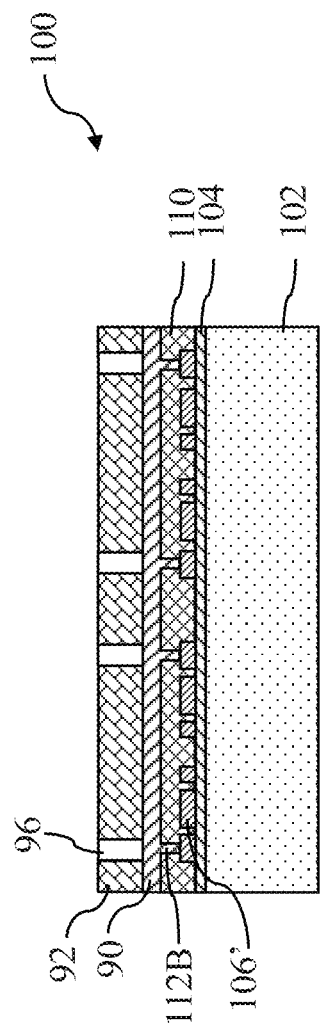
Figures 2, 2H, 3, 4, 5:
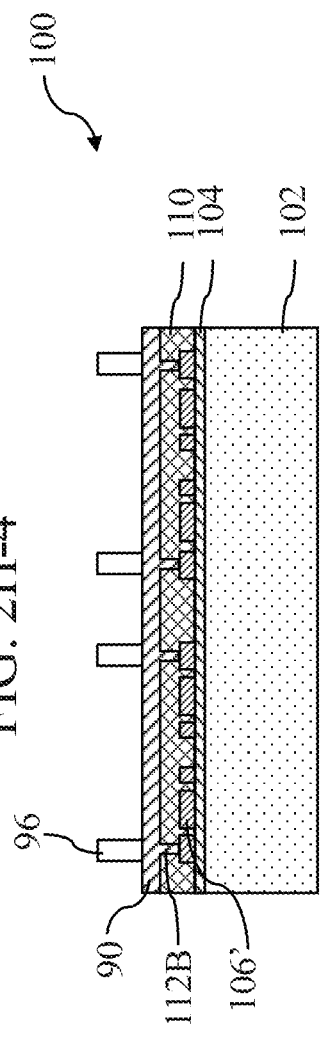
Figures 2, 2H, 3, 4, 5, 6:
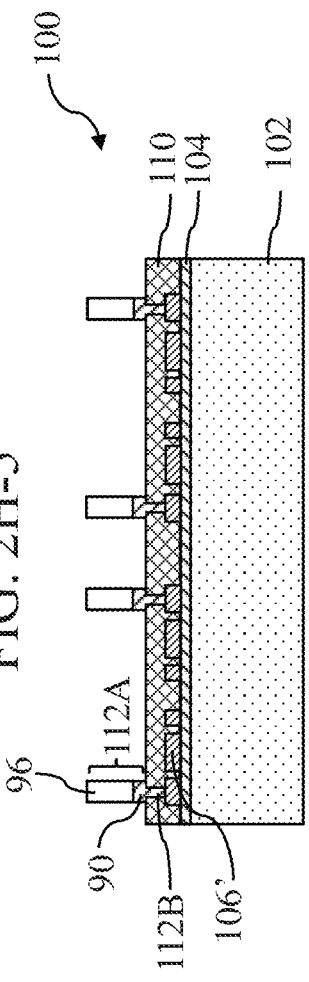

At operation 20, the method 10 (FIG. 1A) forms conductive through-vias 112 over and penetrating the second dielectric layer 110. Referring to FIG. 2H, a plurality of the through-vias 112 are formed. The through-vias 112 are also referred to as Through InFo Vias (TIVs) 112. As shown, the TIVs 112 each have two portions, a bottom portion 112B and a top portion 112A. The bottom portion 112B penetrates the dielectric layer 110 and electrically contacts some of the conductive lines 106'. The top portion 112A extends above the dielectric layer 110. In the present embodiment, the bottom portion 112B is narrower than the top portion 112A. In alternative embodiments, the bottom portion 112B may have the same width as the top portion 112A, or may be wider than the top portion 112A. The TIVs 112 may be formed using CVD, PVD, plating, or other suitable techniques. One exemplary formation process is illustrated in FIGS. 2H-1 through 2H-6.

Referring to FIG. 2H-1, the bottom portions 112B are formed in the dielectric layer 110 using a process that includes photolithography, deposition, and chemical mechanical planarization (CMP) processes. The photolithography process forms a plurality of openings through the dielectric layer 110 to expose some of the conductive lines 106'. The deposition process deposits a metal (or a metallic material) over the dielectric layer 110 and filling into the plurality of openings. The CMP process removes the portions of the metal extending over the dielectric layer 110. The remaining portions of the metal become the bottom portions 112B of the TIVs 112. In embodiments, the bottom portions 112B may comprise copper, aluminum, tungsten, nickel, or alloys thereof.

Referring to FIG. 2H-2, a seed layer 90 is deposited over the dielectric layer 110. The seed layer 90 may comprise copper, copper alloy, aluminum, titanium, titanium alloy, or combinations thereof. The seed layer 90 may comprise one layer or multiple layers of metal, and may be formed by CVD or PVD processes. Referring to FIG. 2H-3, a resist layer 92 is formed over the seed layer 90 and is patterned to have a plurality of openings 94 through a photolithography process.

Referring to FIG. 2H-4, metal features 96 are formed in the openings 94 using a plating process, either electro plating or electro-less plating. The metal features 96 may comprise copper, aluminum, tungsten, nickel, or alloys thereof. The metal features 96 and the seed layer 90 may comprise the same material. Alternatively, they may comprise different materials.

Referring to FIG. 2H-5, the resist layer 92 is removed, using stripping or other methods. Referring to FIG. 2H-6, the seed layer 90 is etched using the metal features 96 as an etch mask. Portions of the seed layer 90 not covered by the metal features 96 are removed. The remaining portions of the seed layer 90 and the metal features 96 collectively form the top portion 112A of the TIVs 112. Although the seed layer 90 is shown as a layer separate from the metal features 96, when the seed layer 90 and the metal features 96 are formed of same or similar material, the two layers may be merged without distinguishable interface between them. In alternative embodiments, there may be a distinguishable interface between the see layer 90 and the metal features 96.

Figure 2I:
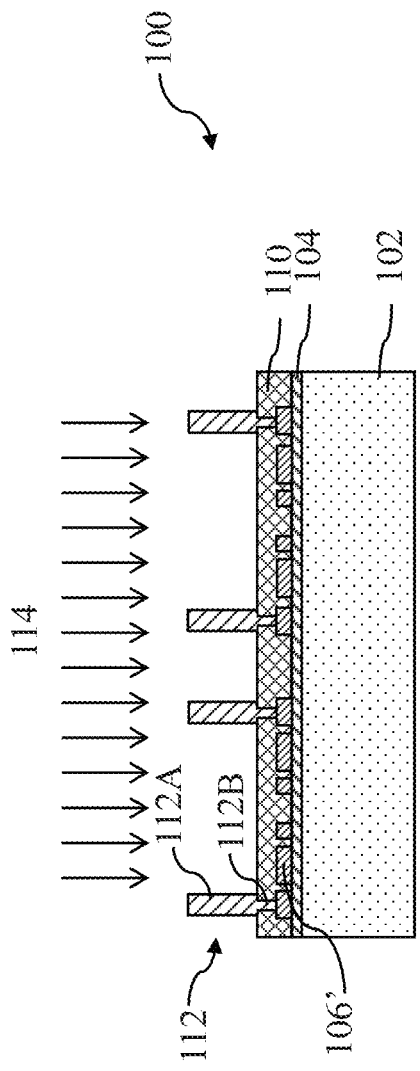
Figure 2J:
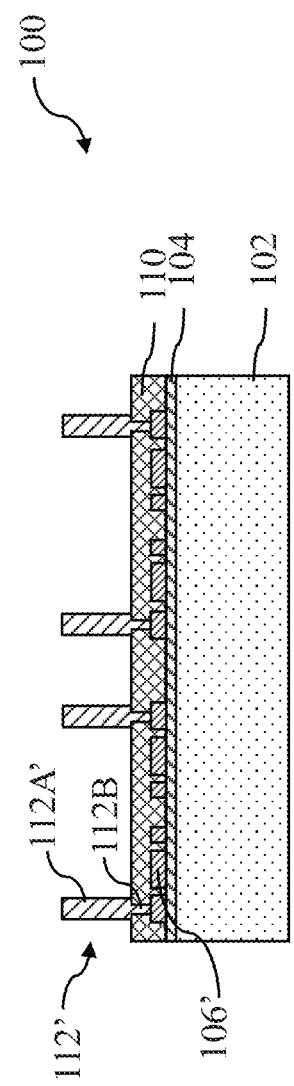

At operation 22, the method 10 (FIG. 1A) treats the TIVs 112 with a second chemical 114 to roughen the surfaces of the TIVs 112. Referring to FIG. 2I, the second chemical 114 is being applied to the TIVs 112. As the bottom portions 112B are buried in the dielectric layer 110, only the top and sidewall surfaces of the top portion 112A are roughened by the second chemical 114. Hence, the top portions 112A and the bottom portions 112B may have different surface roughness. The roughened top portions 112A are referred to as the top portions 112A' and the roughened TIVs 112 are referred to the TIVs 112' (FIG. 2J). In an embodiment, the chemical 114 is selective to the micro structure and grain size of the material used for the TIVs 112 so as to increase the local surface roughness thereof. In an embodiment, the chemical 114 comprises the same ingredients as the chemical 108, but with a different concentration because the TIVs 112' and the conductive lines 106' have different target surface roughness. In another embodiment, the chemicals 114 and 108 have different ingredients. In various embodiments, the chemical 114 may include HCOOH, a mixture of $H_2SO_4$ and $H_2O_2$, or a mixture of HCOOH, $H_2SO_4$, and $H_2O_2$ with a concentration ranging from 0.1% to 50%. Other acidic solution may also be suitable for the chemical 114. The chemical 114 may be tuned for the material used in the TIVs 112' and may be further tuned to produce a local roughness on the surfaces of the TIVs 112' based on adhesion requirements and resistance uniformity requirements. The adhesion requirements for the conductive lines 106' and for the TIVs 112' may be different due, at least in part, to different dielectric materials surrounding the two features 106' and 112'. In one example, the conductive lines 106' are surrounded by PBO (the dielectric layer 110) while the TIVs 112' are surrounded by a molding material, which will be described later.

Figure 2K:
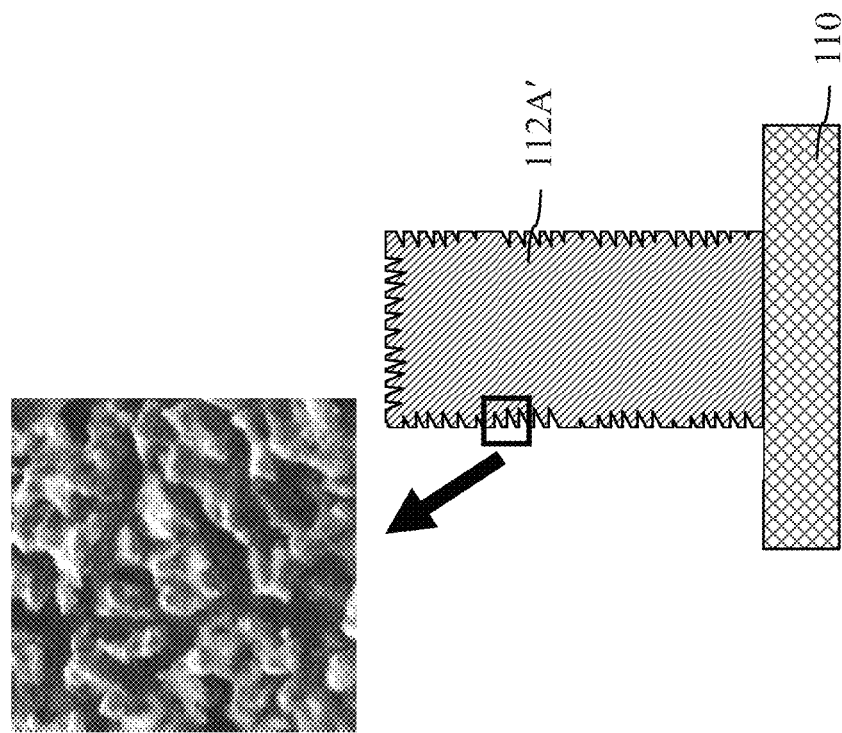
FIG. 2K shows surface structures of two through-vias, in accordance with some embodiments.
Figure 2K:
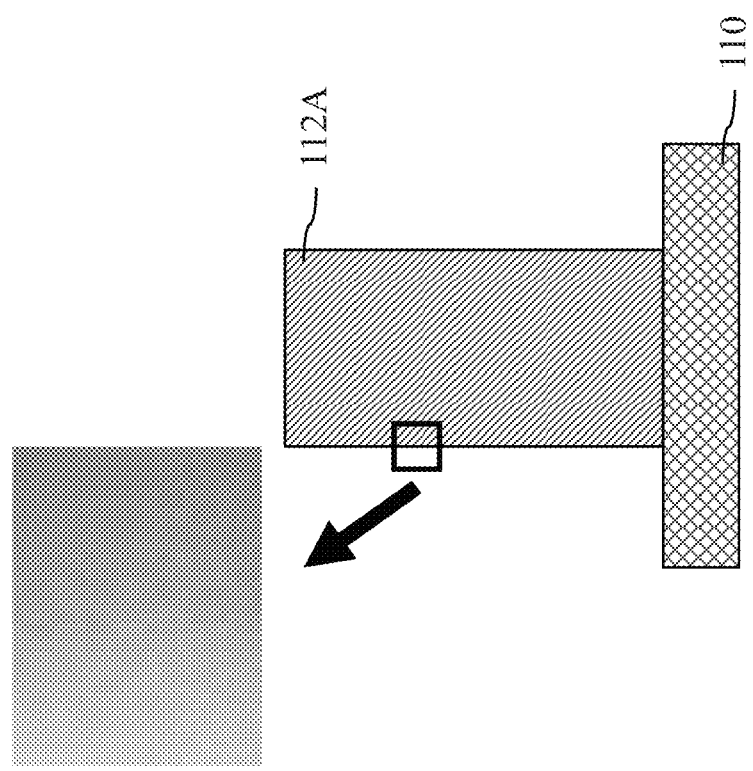

FIG. 2K shows a comparison of the surfaces of the TIVs 112 (before being treated with the chemical 114) and the TIVs 112' (after being treated with the chemical 114). The surface roughness of the TIVs 112' increases substantially both in amplitude and frequency, compared to the TIVs 112. In an embodiment, the $R_{local}$ of the TIVs 112' is greater than 1. In an embodiment, the $R_{local}$ of the TIVs 112' is much greater than 1 ($R_{local} \gg 1$), such as 10 or more. In an embodiment, the arithmetical mean roughness (Ra) of the surface of the TIVs 112' is greater than 0.1 micron (μm).

At operation 24, the method 10 (FIG. 1B) places a plurality of device dies 116 over the dielectric layer 110. Referring to FIG. 2L, the device dies 116 may each include active devices (e.g., transistors) and/or passive devices (e.g., resistors, capacitors, inductors), and may include logic devices, memory devices, power devices, computing devices, and so on. The device dies 116 each include a substrate 118 (e.g., a silicon substrate) and metal pillars 119 electrically coupled to the active/passive devices in the device dies 116. The device dies 116 further include a dielectric layer 120 where the metal pillars 119 are at least partially buried into. In the present embodiment, the metal pillars 119 and the dielectric layer 120 have coplanar top surfaces. In another embodiment, the metal pillars 119 may protrude above the top surface of the dielectric layer 120. In an embodiment, the device dies 116 are attached to the dielectric layer 110 through an adhesive layer (not shown). For example, the adhesive layer may be applied between the substrate 118 and the dielectric layer 110.

At operation 26, the method 10 (FIG. 1B) molds the device dies 116 and the TIVs 112' in a molding material 122.

Referring to FIG. 2M, the molding material 122 fills the various gaps such as the gaps between the device dies 116 and the TIVs 112', and may be in direct contact with the dielectric layer 110. The molding material 122 may include a molding compound, a molding underfill, an epoxy, or a resin. As shown in FIG. 2M, a top surface of the molding material 122 is higher than the top surfaces of the device dies 116 and the TIV 112'. In the present embodiment, the molding material 122 adheres to the TIVs 112' much better than it would adhere to the TIVs 112 because the TIVs 112' have rugged surfaces, as discussed above. In some experiment, an improvement of three or more times of adhesion strength has been observed. This advantageously increases the reliability and durability of the package assembly 100 over conventional InFo packages.

At operation 28, the method 10 (FIG. 1B) thins the molding material 122 to expose top surfaces of the TIVs 112' and of the metal pillars 119, as shown in FIG. 2N. In an embodiment, the operation 28 includes a grinding process to thin the molding material 122. In another embodiment, the operation 28 includes a CMP process to thin the molding material 122. The TIVs 112' and the metal pillars 119 may be thinned by the operation 28 as well. As a result of the operation 28, the top surfaces of the TIVs 112', the top surfaces of the metal pillars 119, and a top surface of the molding material 122 become coplanar. In an embodiment, the operation 28 further includes a cleaning process, subsequent to the thinning process, to remove any metal residues produced by the thinning process.

At operation 30, the method 10 (FIG. 1B) forms a second RDL 123 over the molding material 122. Referring to FIG. 2O, the RDL 123 includes a plurality of conductive lines 124. Some of the conductive lines 124 are electrically coupled to the TIVs 112' and the metal pillars 119. In an embodiment, the formation of the RDL 123 is substantially similar to the formation of the RDL 105 (FIG. 2B), including the materials used and the steps performed. In embodiments, the conductive lines 124 may comprise a metal or a metal alloy including aluminum, copper, tungsten, and/or alloys thereof.

At operation 32, the method 10 (FIG. 1B) treats the conductive lines 124 with a third chemical 126 to roughen the top and sidewall surfaces of the conductive lines 124, as illustrated in FIG. 2P. The roughened conductive lines 124 are referred to as the conductive lines 124' (FIG. 2Q). In an embodiment, the operation 32 is substantially similar to the operation 16. The third chemical 126 may be substantially similar to the first chemical 108. The chemical 126 is tuned for the material used for the conductive lines 124', and is further tuned to meet the target roughness of the conductive lines 124'. In an embodiment, the conductive lines 124' have a surface roughness similar to that of the conductive lines 106'.

At operation 34, the method 10 (FIG. 1B) deposits a dielectric layer 128 over and in direct contact with the conductive lines 124' (FIG. 2R). In an embodiment, the operation 34 is substantially similar to the operation 18. In embodiments, the dielectric layer 128 may include a polymer such as polyimide, PBO, BenzoCycloButene (BCB), Ajinomoto Buildup Film (ABF), Solder Resist (SR) film, or the like. Due to the rough (or rugged) surfaces of the conductive lines 124', the dielectric layer 128 adheres to the conductive lines 124' much better than it would adhere to the conductive lines 124.

At operation 36, the method 10 (FIG. 1B) performs further steps to complete the package assembly 100. For example, the operation 36 may form conductive vias 130 in the dielectric layer 128 (FIG. 2R). The conductive vias 130 are electrically coupled to the conductive lines 124'. The operation 36 may further form conductive lines 132 over a top surface of the dielectric layer 128 (FIG. 2R).

The operation 36 may further form electrical connectors (such as micro bumps or solder balls) 134 over and in direct contact with the conductive liens 132 (FIG. 2S). In an embodiment, the formation of the electrical connectors 134 includes placing solder balls on exposed portions of the conductive lines 132 and reflowing the solder balls. In another embodiment, the formation of the electrical connectors 134 includes a plating step to form solder regions over the conductive lines 132 and reflowing the solder regions.

Figure 2T:
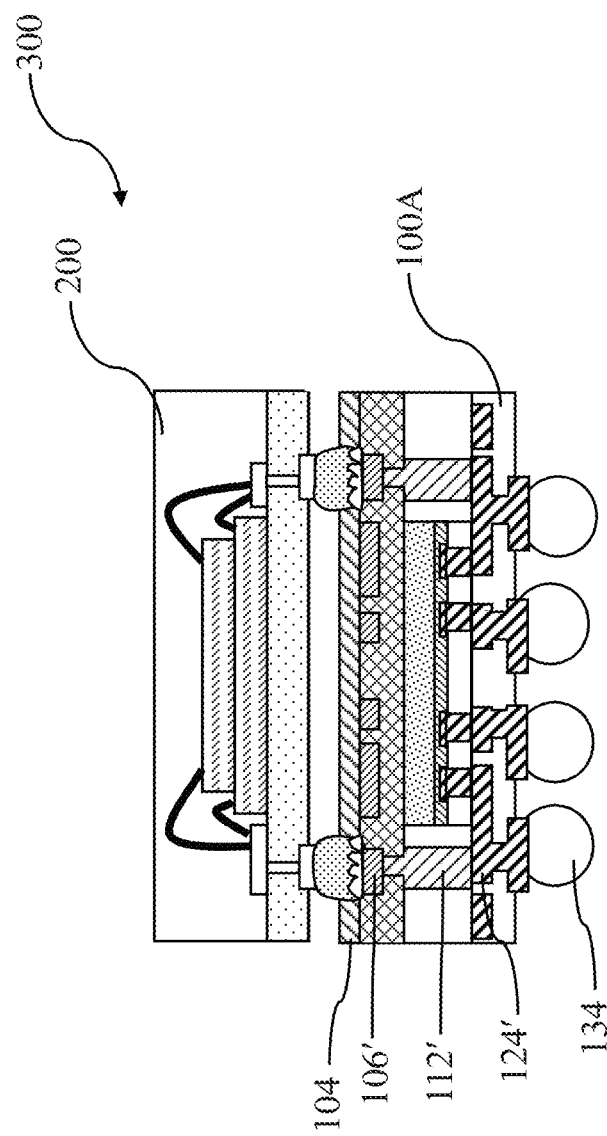

The operation 36 may further include de-bonding, or otherwise separating, the package assembly 100 from the carrier 102, and dicing (or cutting) the package assembly 100 into a plurality of InFo packages 100A (FIG. 2T). The operation 36 may further include mounting another package assembly 200 over an InFo package 100A to form a package-on-package (PoP) assembly 300 (FIG. 2T). As shown in FIG. 2T, the InFo package 100A includes various conductive features 106', 112', 124' having roughened surfaces. The roughened surfaces promote greater adhesion between the respective conductive features and the surround dielectric materials. As a result, the InFo package 100A provides better reliability and durability than conventional InFo packages. In various embodiments, one or more of the conductive features of the InFo package 100A may include roughened surfaces. Other embodiments may be derived from the present disclosure. In one example, an InFo package does not include the conductive lines 106' and the package assembly 200 may be electrically connected to the TIVs 112' directly.

Although not intended to be limiting, one or more embodiments of the present disclosure provide many benefits to a semiconductor device and a formation process thereof. For example, embodiments of the present disclosure provide an InFo package for redistributing I/O pads of a device die to a greater area. The redistribution interconnects such as through-vias and redistribution lines have rugged surfaces that increase adhesion between the interconnects and the dielectric material surrounding the interconnects. This reduces delamination between the interconnects and the dielectric material, and provides for better reliability and durability in the InFo package.

In one exemplary aspect, the present disclosure is directed to a method of forming a package assembly. The method includes forming a first dielectric layer over a carrier substrate; forming a conductive through-via over the first dielectric layer; treating the conductive through-via with a first chemical, thereby roughening surfaces of the conductive through-via; and molding a device die and the conductive through-via in a molding material.

In another exemplary aspect, the present disclosure is directed to a method of forming a package assembly. The method includes forming a first dielectric layer over a carrier substrate; forming a first conductive line over the first dielectric layer; and treating the first conductive line with a first chemical, thereby roughening surfaces of the first conductive line. The method further includes forming a second dielectric layer over and in direct contact with the first conductive line and forming a conductive through-via over and penetrating the second dielectric layer, wherein the conductive through-via is electrically coupled to the first conductive line. The method further includes treating the conductive through-via with a second chemical, thereby roughening surfaces of the conductive through-via. The method further includes placing a device die over the second dielectric layer and molding the device die and the conductive through-via in a molding material.

In yet another exemplary aspect, the present disclosure is directed to an apparatus. The apparatus includes a molding compound, a device die molded in the molding compound, and a conductive through-via penetrating through the molding compound. The conductive through-via includes a rough surface. A ratio between an arithmetical mean roughness (Ra) of the surface and a mean spacing between peaks (Sm) of the surface is greater than 1 (Ra/Sm>1).

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a package assembly, comprising:
    forming a first dielectric layer over a carrier substrate;
    forming a first portion of a conductive through-via through the first dielectric layer, wherein the first portion includes a first set of opposing sidewall surfaces embedded within the first dielectric layer, wherein the forming of the first portion comprises:
        forming an opening through the first dielectric layer,
        depositing a metal layer in the opening and over the first dielectric layer, and
        performing a planarization process to remove the metal layer over a top surface of the first dielectric layer;
    after forming the first portion of the conductive through-via, forming a second portion of the conductive through-via over the first portion, wherein the second portion includes a second set of opposing sidewall surfaces above the first dielectric layer;
    treating the second portion of the conductive through-via with a first chemical, thereby roughening the second set of opposing sidewall surfaces of the second portion of the conductive through-via while the first set of opposing sidewall surfaces of the first portion of the conductive through-via are protected by the first dielectric layer physically contacting the first portion of the conductive through-via, wherein the first chemical includes an inorganic acid;
    after treating the second portion of the conductive through-via with the first chemical, coupling a device die to the first dielectric layer; and
    after coupling the device die to the first dielectric layer, forming a molding material on the device die and between the device die and the roughened second set of opposing sidewall surfaces of the conductive through-via, wherein the molding material is in direct contact with the roughened second set of opposing sidewall surfaces of the conductive through-via.

2. The method of claim 1, wherein the conductive through-via comprises copper.

3. The method of claim 2, wherein the first chemical includes a mixture of $H_2SO_4$ and $H_2O_2$ or a mixture of HCOOH, $H_2SO_4$ and $H_2O_2$.

4. The method of claim 1, further comprising, before the forming of the first dielectric layer:
    forming a second dielectric layer over the carrier substrate;
    depositing a conductive layer over the second dielectric layer;
    patterning the conductive layer to form a conductive line over the second dielectric layer; and
    treating the conductive line with a second chemical, thereby roughening surfaces of the conductive line, wherein:
    the first dielectric layer is formed over the conductive line and is in direct contact with the conductive line.

5. The method of claim 4, wherein the conductive through-via and the conductive line each include copper; the first chemical includes a mixture of $H_2SO_4$ and $H_2O_2$ or a mixture of HCOOH, $H_2SO_4$ and $H_2O_2$; and the second chemical includes HCOOH, a mixture of $H_2SO_4$ and $H_2O_2$ or a mixture of HCOOH, $H_2SO_4$ and $H_2O_2$.

6. The method of claim 1, further comprising:
    forming a conductive line over the molding material and the conductive through-via; and
    treating the conductive line with a second chemical, thereby roughening surfaces of the conductive line.

7. The method of claim 6, further comprising, before the forming of the conductive line:
    thinning the molding material to expose the conductive through-via.

8. The method of claim 6, wherein the conductive through-via and the conductive line each include copper; the first chemical includes a mixture of $H_2SO_4$ and $H_2O_2$ or a mixture of HCOOH, $H_2SO_4$, and $H_2O_2$; and the second chemical includes HCOOH, a mixture of $H_2SO_4$ and $H_2O_2$, or a mixture of HCOOH, $H_2SO_4$ and $H_2O_2$.

9. The method of claim 6, further comprising:
    forming a dielectric layer over and in direct contact with the conductive line.

10. The method of claim 1, wherein the inorganic acid includes $H_2SO_4$.

11. A method of forming a package assembly, comprising:
    forming a first dielectric layer over a carrier substrate;
    forming a first conductive line over the first dielectric layer;
    performing a first treatment process on the first conductive line with a first chemical, thereby roughening surfaces of the first conductive line;
    forming a second dielectric layer over and in direct contact with the first conductive line;
    forming a first portion of a conductive through-via through the second dielectric layer, wherein the first portion of the conductive through-via has a first set of opposing exterior sidewall surfaces that are embedded within the second dielectric layer, wherein the first portion of the conductive through-via is in direct contact with the roughened surfaces of the first conductive line and electrically coupled to the first conductive line, wherein the forming of the first portion comprises:
        forming a first opening through the second dielectric layer,
        depositing a metal layer in the first opening and over the second dielectric layer, and
        performing a planarization process to remove the metal layer over a top surface of the second dielectric layer;
    after forming the first portion of the conductive through-via, forming a second portion of the conductive through-via over the first portion, wherein the second portion includes a second set of opposing exterior sidewall surfaces above the second dielectric layer, wherein the forming of the second portion comprises:
depositing a seed layer over the first portion of the conductive through-via,
depositing a resist layer over the seed layer,
forming a second opening through the resist layer,
plating the second portion of the conductive through-via in the second opening,
removing the resist layer, and
etching the seed layer using the second portion of the conductive through-via as an etch mask;
performing a second treatment process on the second portion of the conductive through-via with a second chemical, thereby roughening the second set of opposing exterior sidewall surfaces of the second portion of the conductive through-via while the first set of opposing exterior sidewall surfaces of the first portion of the conductive through-via are protected by the second dielectric layer physically contacting the first portion of the conductive through-via, the second treatment process being different than the first treatment process;
after performing the second treatment process on the second portion of the conductive through-via with the second chemical, placing a device die over the second dielectric layer; and
after placing the device die over the second dielectric layer, molding the device die and the conductive through-via in a molding material such that the molding material extends between the device die and the roughened second set of opposing exterior sidewall surfaces, the device die physically contacting the second dielectric layer, wherein the molding material is in direct contact with the roughened second set of opposing exterior sidewall surfaces.

12. The method of claim 11, wherein the first conductive line and the conductive through-via each include copper; the first chemical includes HCOOH, a mixture of $H_2SO_4$ and $H_2O_2$ or a mixture of HCOOH, $H_2SO_4$, and $H_2O_2$; and the second chemical includes HCOOH, a mixture of $H_2SO_4$ and $H_2O_2$, or a mixture of HCOOH, $H_2SO_4$ and $H_2O_2$.

13. The method of claim 12, wherein the first and second chemicals include same ingredients but different concentrations.

14. The method of claim 11, wherein the conductive through-via and the first conductive line are treated to have different surface roughness.

15. The method of claim 11, further comprising:
thinning the molding material to expose the conductive through-via;
forming a second conductive line over and electrically coupled to the conductive through-via;
treating the second conductive line with a third chemical, thereby roughening surfaces of the second conductive line; and
depositing a third dielectric layer over and in direct contact with the second conductive line.

16. A method of forming a package assembly, comprising:
depositing a first dielectric layer over a carrier substrate;
forming a conductive line over the first dielectric layer;
depositing a second dielectric layer over the conductive line and in direct contact with the conductive line;
forming a first portion of a conductive through-via through the second dielectric layer, wherein the first portion includes a first width and a first set of opposing sidewall surfaces that are embedded within the second dielectric layer, wherein the forming of the first portion comprises:
forming an opening through the second dielectric layer,
depositing a metal layer in the opening and over the second dielectric layer, and
performing a planarization process to remove the metal layer over a top surface of the second dielectric layer;
after forming the first portion of the conductive through-via, forming a second portion of the conductive through-via over the first portion, wherein the second portion includes a second width greater than the first width and a second set of opposing sidewall surfaces above the second dielectric layer;
treating the second portion of the conductive through-via with an inorganic acid, thereby roughening the second set of opposing sidewall surfaces of the second portion of the conductive through-via while the first set of opposing sidewall surfaces of the first portion of the conductive through-via are protected by the second dielectric layer physically contacting the first portion of the conductive through-via;
after treating the second portion of the conductive through-via with the inorganic acid, coupling a device die to the second dielectric layer; and
after coupling the device die to the second dielectric layer, molding the device die and the conductive through-via in a molding material that physically contacts the device die, wherein the molding material is in direct contact with the roughened second set of opposing sidewall surfaces.

17. The method of claim 16, wherein the conductive through-via comprises copper.

18. The method of claim 16, further comprising, before depositing the first dielectric layer:
treating the conductive line with an acid and $H_2O_2$, thereby roughening surfaces of the conductive line.

19. The method of claim 16 wherein, before the forming of the conductive line:
thinning the molding material to expose the conductive through-via.

20. The method of claim 16, wherein the inorganic acid includes $H_2SO_4$.

* * * * *